US010141252B2

(12) United States Patent
Sung et al.

(10) Patent No.: US 10,141,252 B2
(45) Date of Patent: Nov. 27, 2018

(54) SEMICONDUCTOR PACKAGES

(71) Applicant: Advanced Semiconductor Engineering, Inc., Kaohsiung (TW)

(72) Inventors: Yuan-Fu Sung, Kaohsiung (TW); Shin-Hua Chao, Kaohsiung (TW); Ming-Chi Liu, Kaohsiung (TW); Hung-Sheng Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/435,143

(22) Filed: Feb. 16, 2017

(65) Prior Publication Data

US 2018/0233443 A1 Aug. 16, 2018

(51) Int. Cl.
*H01L 23/495* (2006.01)
*H01L 23/498* (2006.01)
*H01L 23/00* (2006.01)
*H01L 21/48* (2006.01)
*H01L 21/56* (2006.01)
*H01L 23/31* (2006.01)

(52) U.S. Cl.
CPC ...... *H01L 23/49838* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/49822* (2013.01); *H01L 23/49827* (2013.01); *H01L 23/49866* (2013.01); *H01L 23/49894* (2013.01); *H01L 24/16* (2013.01); *H01L 2224/16235* (2013.01)

(58) Field of Classification Search
CPC ............... H01L 23/49838; H01L 24/16; H01L 23/49822; H01L 23/49894; H01L 23/49866; H01L 23/3114; H01L 23/498277; H01L 21/4857; H01L 21/4853; H01L 21/565; H01L 21/486; H01L 2224/16235; H01L 23/5226; H01L 23/5227; H01L 23/5228
USPC ........................................................ 257/668
See application file for complete search history.

(56) References Cited

U.S. PATENT DOCUMENTS

| | | | | |
|---|---|---|---|---|
| 5,841,193 A * | 11/1998 | Eichelberger | ....... | H01L 23/5389 257/723 |
| 7,666,711 B2 * | 2/2010 | Pagaila | ................. | H01L 21/561 257/620 |
| 9,231,026 B2 * | 1/2016 | Kolb | ........................ | H01L 27/22 |
| 2014/0346670 A1 | 11/2014 | Su et al. | | |
| 2015/0069620 A1 * | 3/2015 | Chi | ..................... | H01L 23/5226 257/774 |
| 2015/0364422 A1 | 12/2015 | Zhai et al. | | |

* cited by examiner

*Primary Examiner* — Vu A Vu
(74) *Attorney, Agent, or Firm* — Foley & Lardner LLP; Cliff Z. Liu

(57) ABSTRACT

A semiconductor package includes: a passivation layer having a first surface and a second surface opposite to the first surface, the passivation layer defining a through hole extending from the first surface to the second surface, the through hole being further defined by a first sidewall and a second sidewall of the passivation layer; a first conductive layer on the first surface of the passivation layer and the first sidewall; a second conductive layer on the second surface of the passivation layer and the second sidewall; and a third conductive layer between the first conductive layer and the second conductive layer.

15 Claims, 28 Drawing Sheets

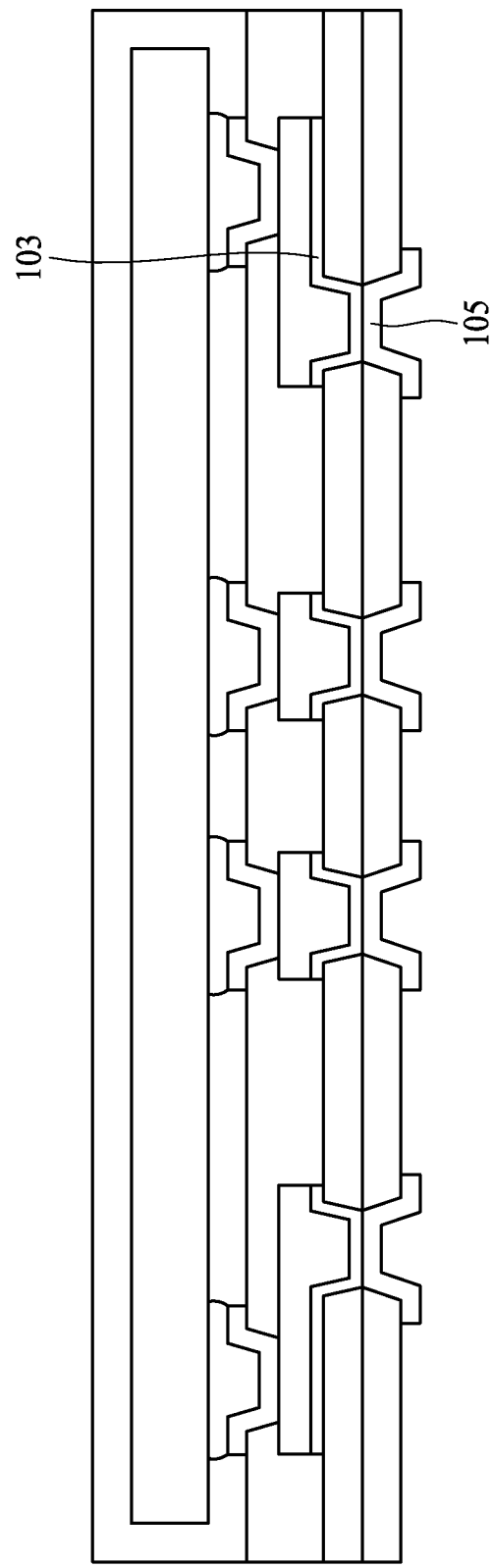

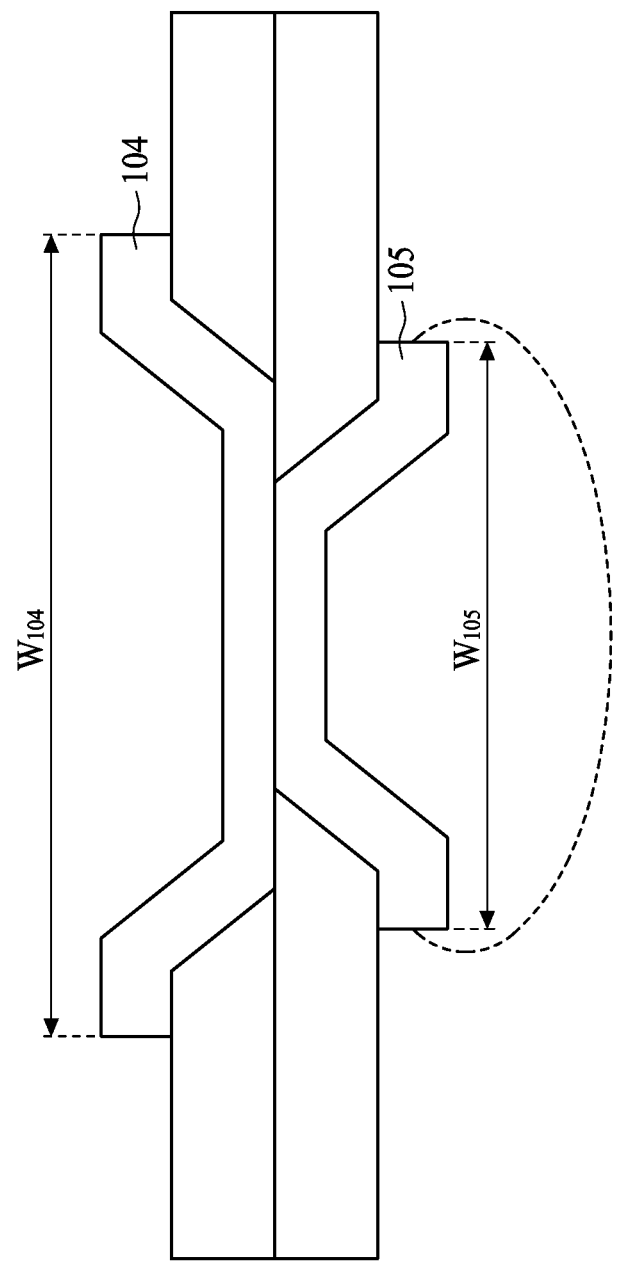

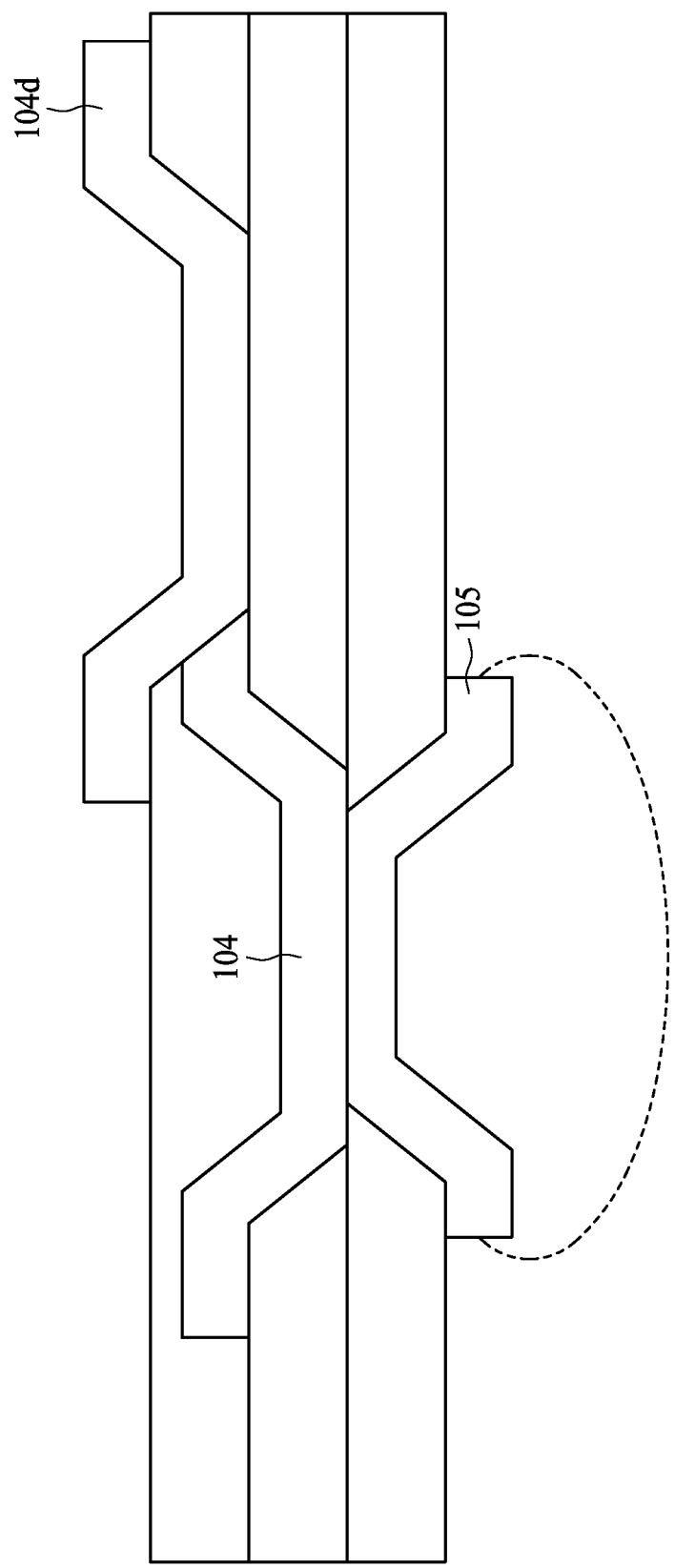

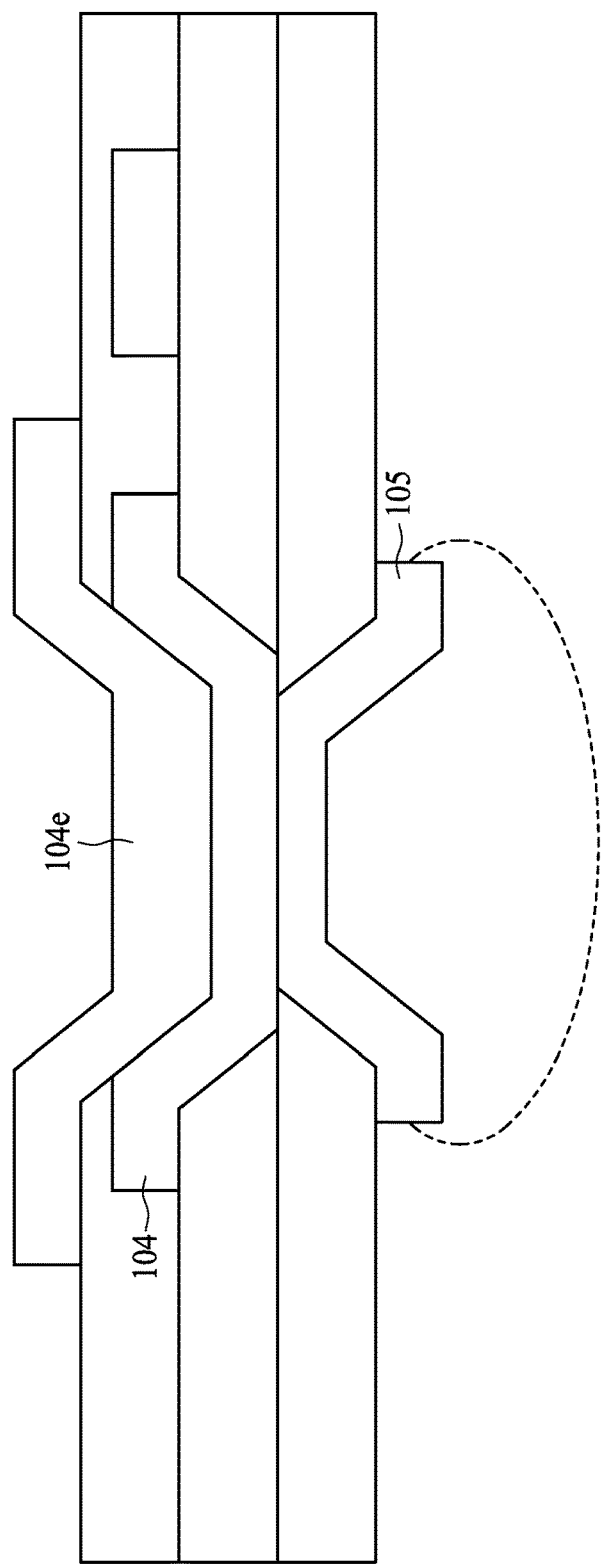

SEMICONDUCTOR PACKAGES

BACKGROUND

1. Technical Field

The present disclosure generally relates to a semiconductor package, and more particularly relates to a semiconductor package including a stacked-via structure.

2. Description of Related Art

Since the first integrated circuit appeared, the semiconductor industry has experienced continuous rapid growth due to constant improvements in the integration density of various electronic components and semiconductor packages. For example, these improvements in integration density have come from repeated reductions in minimum feature sizes, allowing more components to be integrated into a semiconductor chip or package. One approach for allowing more components to be integrated into a semiconductor structure is the adoption of three dimensional integrated circuit (3D IC) stacking techniques, in which via structures are stacked on one another as a stacked-via structure. When fabricating conventional stacked-via structures, polymer residue caused by insufficient exposure may lead to open circuit or high resistance between the stacked vias. As such, extra processes may be used to remove polymer residue, which may increase the cost of manufacturing a stacked-via structure. Therefore, a semiconductor package that would avoid the problem of polymer residue is desirable.

SUMMARY

In some embodiments, according to some aspects, a semiconductor package includes: a passivation layer having a first surface and a second surface opposite to the first surface, the passivation layer defining a through hole extended from the first surface to the second surface, the through hole being further defined by a first sidewall and a second sidewall; a first conductive layer on the first surface of the passivation layer and the first sidewall; a second conductive layer on the second surface of the passivation layer and the second sidewall; and a third conductive layer between the first conductive layer and the second conductive layer.

In some embodiments, according to some aspects, a semiconductor package includes: a passivation layer having a first surface and a second surface opposite to the first surface, the passivation layer defining a through hole extending from the first surface to the second surface, the through hole being further defined by a sidewall; a first conductive layer between the first surface and the second surface of the passivation layer and sealing the through hole; a second conductive layer adjacent to the first conductive layer; and a third conductive layer opposite the second conductive layer and adjacent to the first conductive layer.

In some embodiments, according to some aspects, a method of manufacturing a semiconductor package includes: providing a first passivation layer on a carrier; patterning the first passivation layer to define a first hole exposing the carrier; forming or disposing a first conductive layer on the exposed carrier; forming or disposing a second conductive layer on the first conductive layer; replacing the carrier with a second passivation layer; patterning the second passivation layer to define a second hole exposing the first conductive layer; and forming or disposing a third conductive layer on the exposed first conductive layer.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

FIG. 4A, FIG. 4B, FIG. 4C, FIG. 4D, FIG. 4E, FIG. 4F, FIG. 4G, FIG. 4H, FIG. 4I and FIG. 4J illustrate a method of manufacturing a semiconductor package in accordance with some embodiments of the present disclosure.

FIG. 5B illustrates a cross-sectional view of a semiconductor package in accordance with some embodiments of the present disclosure.

FIG. 5E illustrates a cross-sectional view of a semiconductor package in accordance with some embodiments of the present disclosure.

FIG. 5F illustrates a semiconductor package in accordance with some embodiments of the present disclosure.

DETAILED DESCRIPTION

Figure 1A:
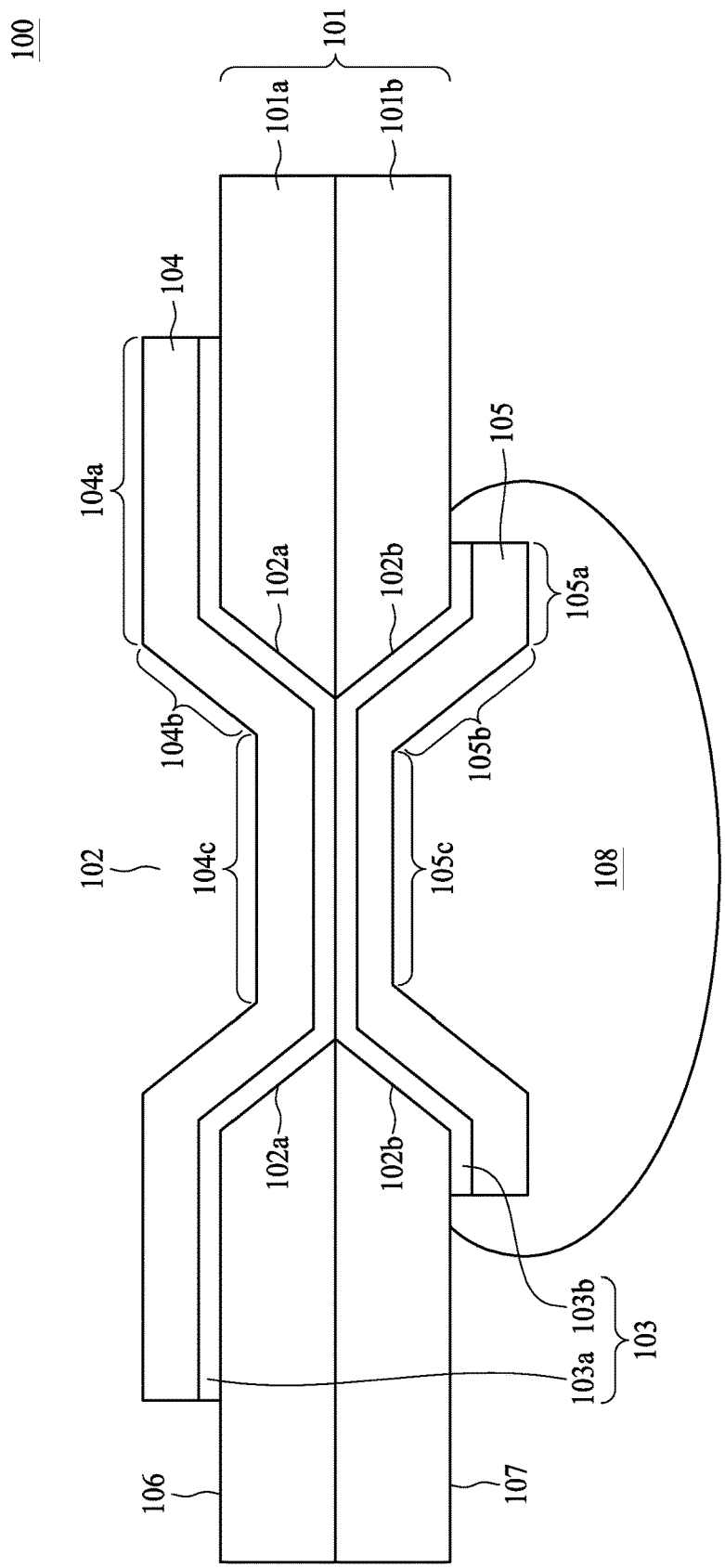
FIG. 1A is a cross-sectional view of a semiconductor package in accordance with some embodiments of the present disclosure.

Manufacturing and use of some embodiments of the present disclosure are discussed in detail below. It should be appreciated, however, that some embodiments set forth can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

Furthermore, it is understood that several processing or manufacturing steps (operations) and/or features of a device may be briefly described. Also, additional processing or manufacturing steps and/or features can be added, and certain of the processing or manufacturing steps and/or features described herein can be removed or changed while implementing the methods described herein or while using the systems and devices described herein. Thus, the following description should be understood to represent examples, and are not intended to suggest that one or more steps or features are required for every implementation.

In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element or feature as illustrated in the Figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may be interpreted accordingly.

FIG. 1A is a cross-sectional view of a semiconductor package structure 100 in accordance with some embodiments of the present disclosure. The semiconductor package structure 100 includes a passivation layer 101. The passivation layer 101 has a surface (e.g., a first surface) 106. The passivation layer 101 has another surface (e.g., a second surface) 107. The surface 107 is opposite to and substantially parallel to the surface 106. The passivation layer 101 includes a through hole 102. The through hole 102 extends from the surface 106 to the surface 107. The through hole 102 is defined by a sidewall 102a and a sidewall 102b. The through hole 102 may have an x-shaped cross section. Alternatively, the through hole 102 may have an hourglass contoured shape.

The semiconductor package structure 100 further includes conductive layers 103, 104 and 105. The conductive layer 104 is disposed on the surface 106 of the passivation layer 101 and on the sidewall 102a. The conductive layer 105 is disposed on the surface 107 of the passivation layer 101 and the sidewall 102b. The conductive layer 103 is disposed between the conductive layer 104 and the conductive layer 105. The conductive layer 103 may directly contact the conductive layer 104. The conductive layer 103 may directly contact the conductive layer 105. The conductive layer 104 and the conductive layer 105 may be separated by the conductive layer 103. The through hole 102 may be sealed by the conductive layer 103. The conductive layers 103, 104, 105 form a stacked-via structure in accordance with some embodiments of the present disclosure.

The conductive layer 104 includes portions 104a, 104b, 104c. The portion 104a is disposed on the surface 106. The portion 104b is disposed on the sidewall 102a. The portion 104c is provided in the through hole 102 and extending substantially parallel to the surface 106. The conductive layer 105 includes portions 105a, 105b, 105c. The portion 105a is disposed on the surface 107. The portion 105b is disposed on the sidewall 102b. The portion 105c is provided in the through hole 102 and extends substantially parallel to the surface 107. The portion 104c of the conductive layer 104 has greater dimensions (e.g., area) than the portion 105c of the conductive layer 105. For example, the portion 104c of the conductive layer 104 covers a larger area of the surface 106 than the portion 105c of the conductive layer 105 covers with respect to an area of the surface 107. In some embodiments, the conductive layer 104 includes a top under bump metallization (UBM) for receiving bonding material and the conductive layer 105 includes a bottom UBM.

In some embodiments, the conductive layer 103 includes metal layers 103a and 103b. The metal layer 103a is adjacent to the conductive layer 104. The metal layer 103b is adjacent to the conductive layer 105. In some embodiments, the metal layer 103a includes a portion disposed on and directly contacting the surface 106, a portion disposed on and directly contacting the sidewall 102a and a portion provided in the through hole 102 and extending substantially parallel to the surface 106. Similarly, the metal layer 103b includes a portion disposed on and directly contacting the surface 107, a portion disposed on and directly contacting the sidewall 102b and a portion provided in the through hole 102 and extending substantially parallel to the surface 107. In some embodiments, the metal layers 103a and 103b serve as seed layers when plating the conductive layers 104 and 105, respectively. The metal layers 103a and 103b of the conductive layer 103 may be formed of a titanium-copper alloy (TiCu).

The passivation layer 101 may comprise polyimide (PI). The passivation layer 101 may be formed of a photosensitive material. The passivation layer 101 may include a polymer layer 101a and a polymer layer 101b. The sidewall 102a is defined by the polymer layer 101a. The sidewall 102b is defined by the polymer layer 101b. In some embodiments, the metal layer 103a is between the conductive layer 104 and the polymer layer 101a, and the metal layer 103b is between the conductive layer 105 and the polymer layer 101b. The total thickness of the conductive layers 103, 104, 105 in the through hole 102 (e.g., the total thickness of the portions 104c and 105c and the conductive layer 103 in the through hole 102) may be smaller than that of the passivation layer 101. A solder ball 108 directly contacts and encapsulates the exposed portion of the conductive layer 105. Due to the reduced thickness, electrical conductance between the portions 104c and 105c is greatly enhanced (since the conductive path within the semiconductor package structure 100 is shortened).

Figure 1B:
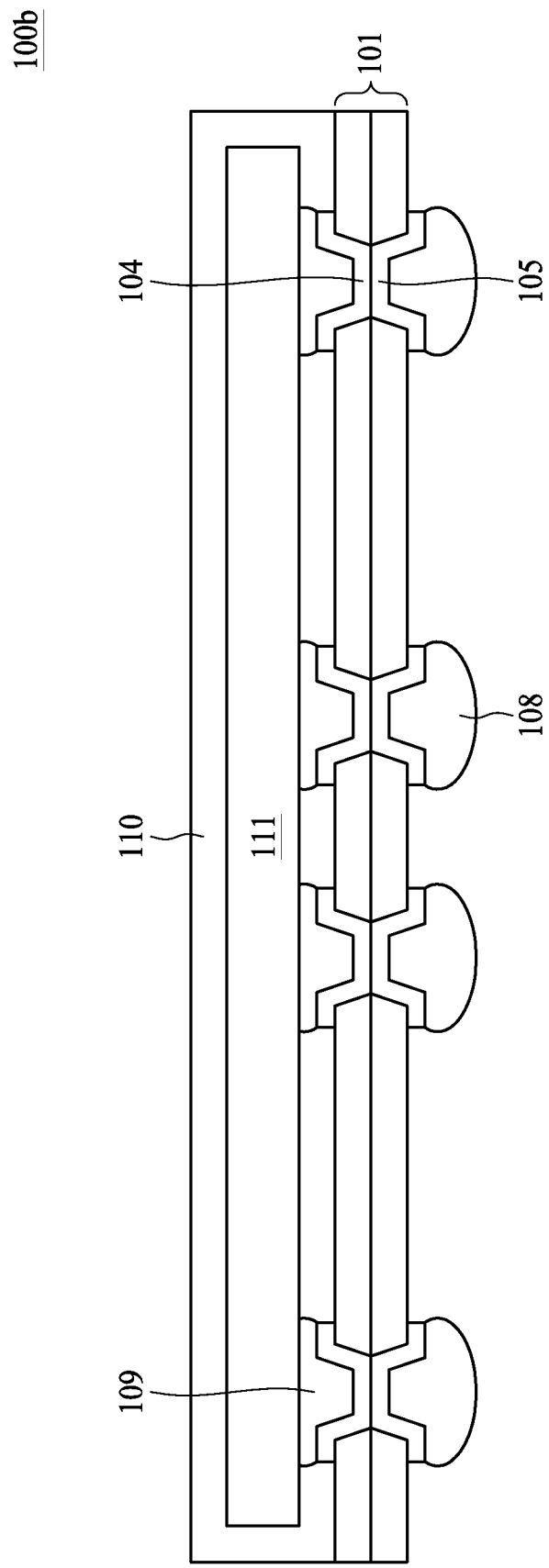
FIG. 1B is a cross-sectional view of a semiconductor package in accordance with some embodiments of the present disclosure.

FIG. 1B is a cross-sectional view of a semiconductor package structure 100b in accordance with some embodiments of the present disclosure. The semiconductor package structure 100b includes a package structure that is similar to the semiconductor package structure 100 as described and illustrated with reference to FIG. 1. The semiconductor package structure 100b includes the passivation layer 101 and the conductive layers 103, 104, 105 (the conductive layer 103 being between the conductive layers 104 and 105 and not shown in the figure). The conductive layer 104 is electrically coupled to a semiconductor structure 111 via a solder ball 109. The semiconductor structure 111 may be a semiconductor die. The semiconductor structure 111 is encapsulated in a molding compound 110.

FIGS. 2A-2I schematically illustrate operations for a method of manufacturing a semiconductor package in accordance with some embodiments of the present disclosure.

Figure 2A:
FIG. 2A, FIG. 2B, FIG. 2C, FIG. 2D, FIG. 2E, FIG. 2F, FIG. 2G, FIG. 2H and FIG. 2I illustrate a method of manufacturing a semiconductor package in accordance with some embodiments of the present disclosure.
Figure 2B:
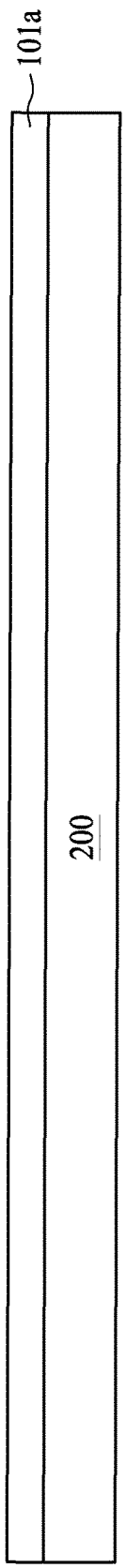
Figure 2C:
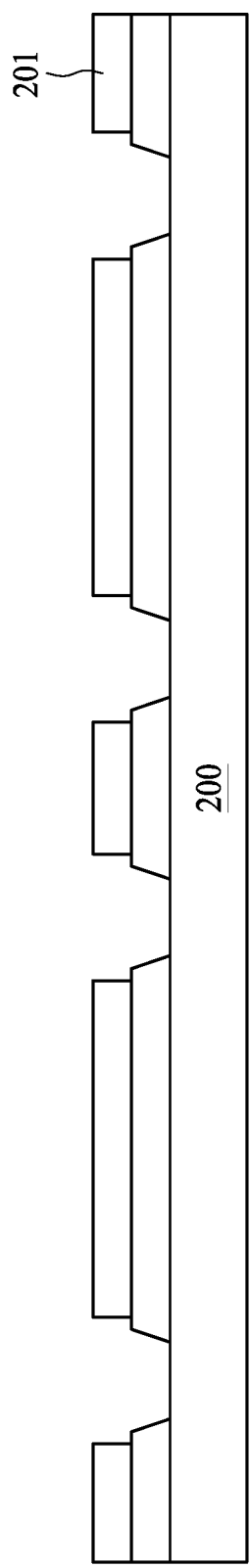
Figure 2D:
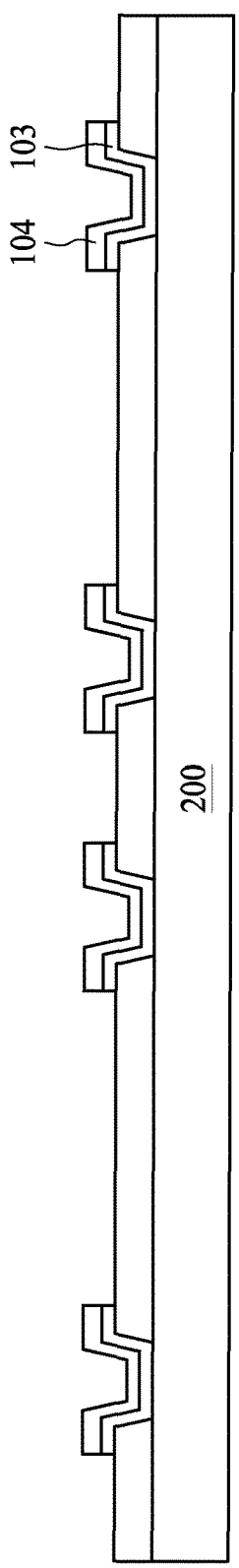
Figure 2E:
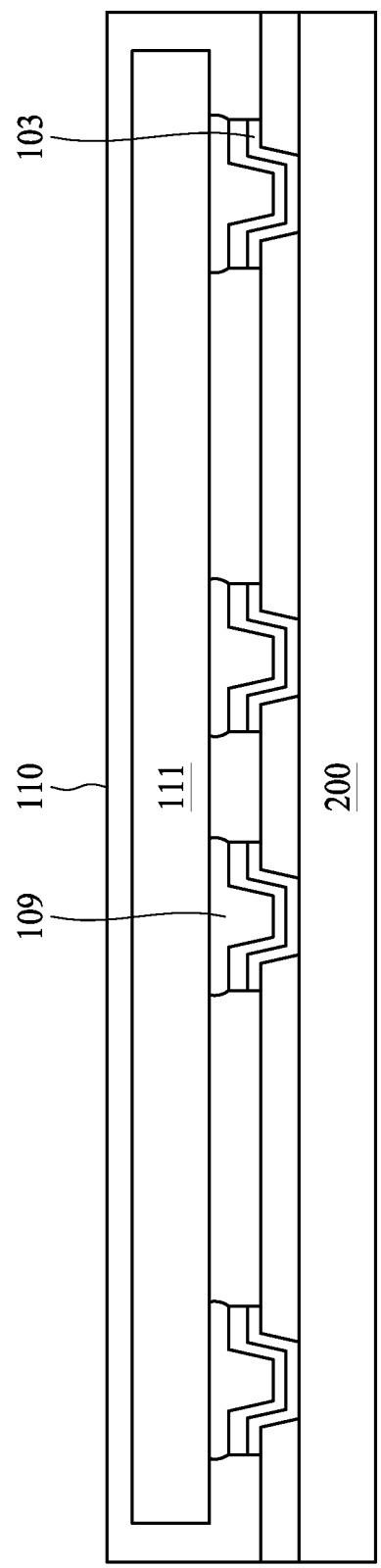
Figure 2F:
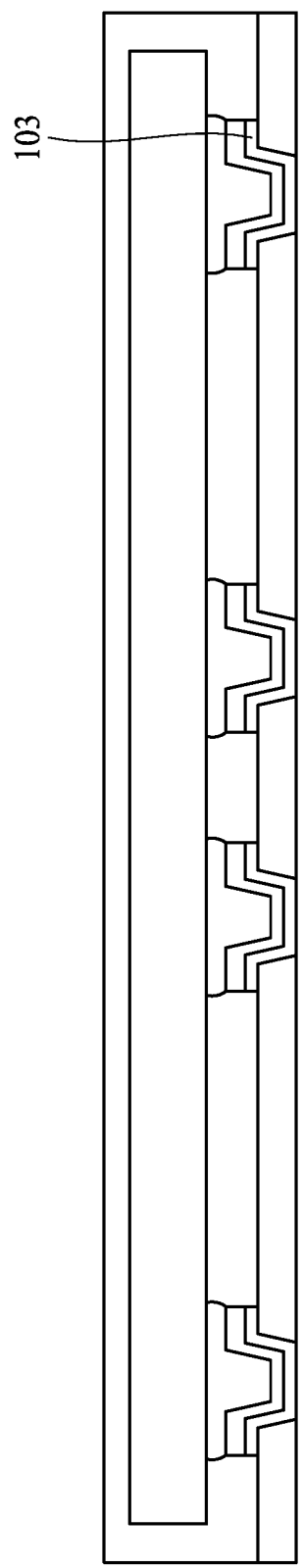
Figure 2G:
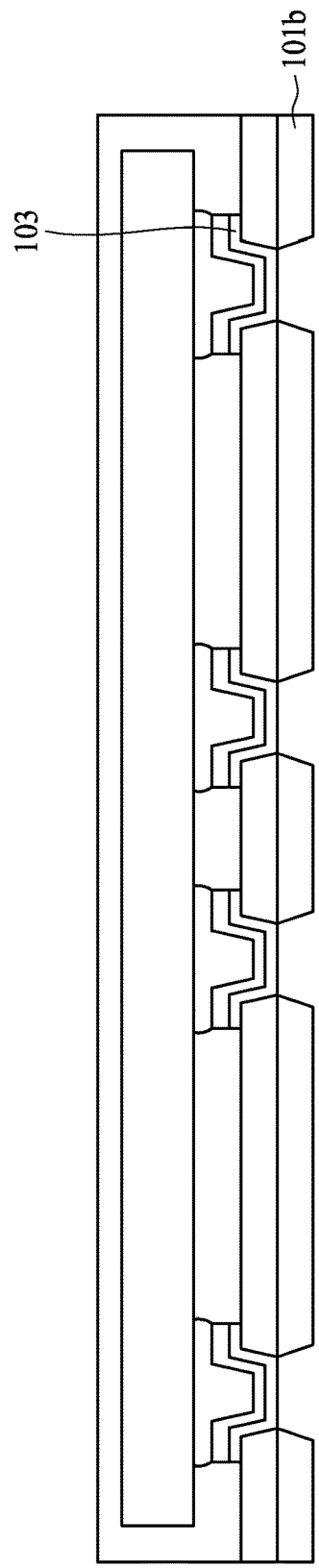
Figure 2H:
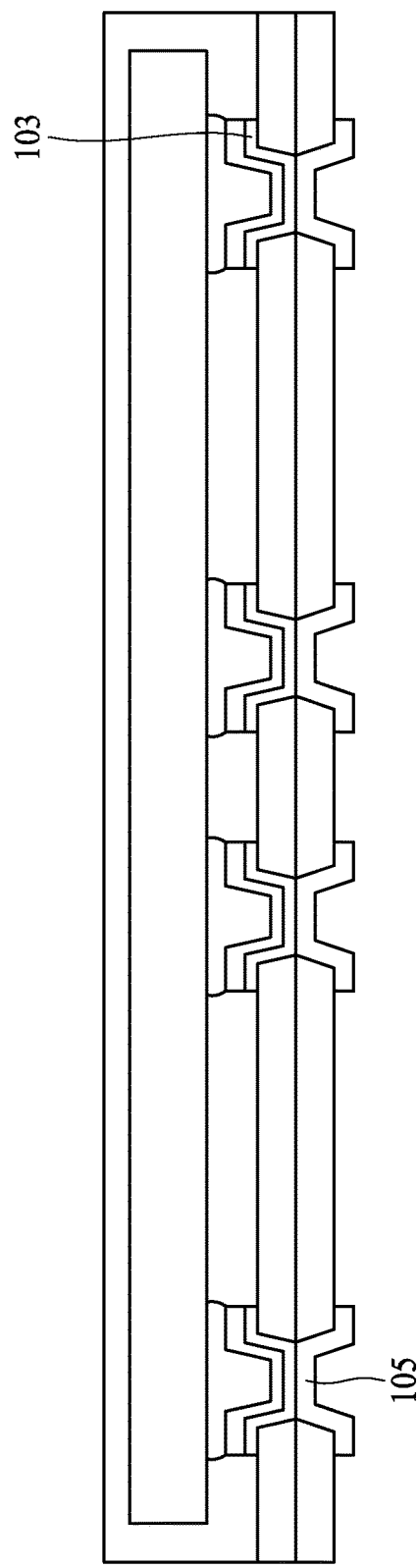
Figure 2I:
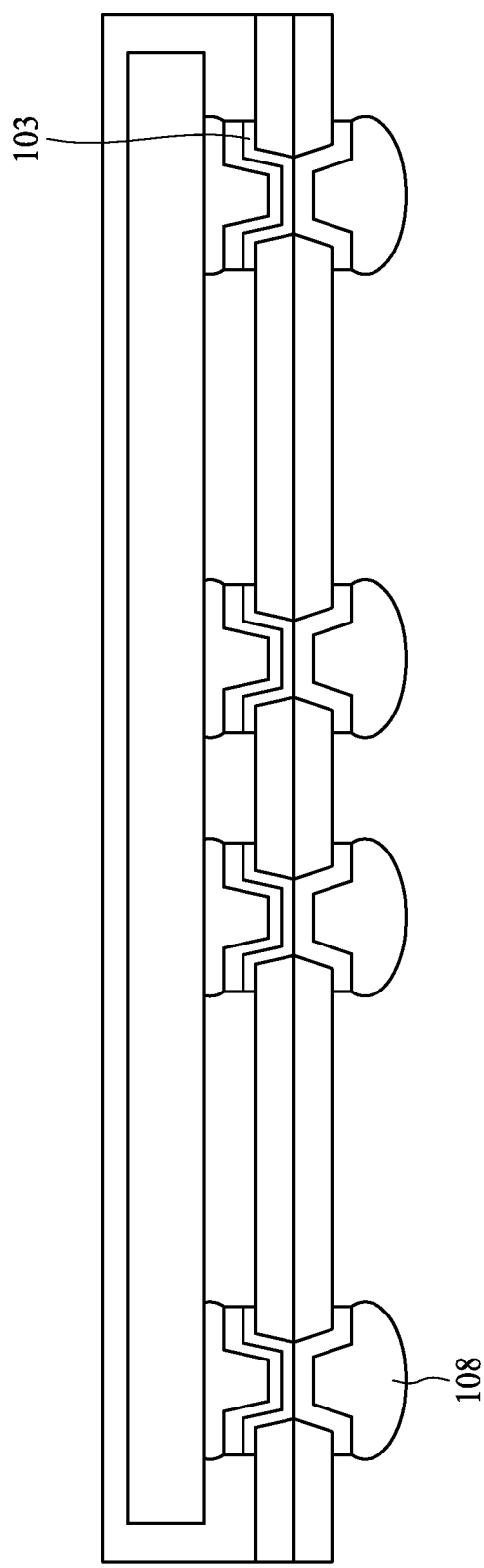

In FIG. 2A, a carrier 200 is provided. In FIG. 2B, the polymer layer 101a is applied on a surface of the carrier 200. In FIG. 2C, a photoresist layer 201 is applied or disposed on a surface of the polymer layer 101a. The photoresist layer 201 is patterned to expose part of the underlying polymer layer 101a (e.g., through a first one or more holes). The exposed portion of the underlying polymer layer 101a may be removed by an etching process. In FIG. 2D, the conductive layer 103 is disposed within the removed portion of the polymer layer 101a and the conductive layer 104 is disposed on the conductive layer 103 (e.g., by plating). In FIG. 2E, the conductive layer 104 is electrically coupled to the semiconductor structure (e.g., a semiconductor die) 111 via the solder ball 109. The semiconductor structure (e.g., the semiconductor die) 111 is then encapsulated in the molding compound 110. In FIG. 2F, the carrier 200 is removed. In FIG. 2G, the polymer layer 101b is applied or disposed on a surface of the polymer layer 101a. The polymer layer 101b is patterned to expose the conductive layer 104 (e.g., through a second one or more holes). In FIG. 2H, the conductive layer 105 is disposed within the open (e.g., removed) portion of the polymer layer 101b (e.g., by plating). Alternatively, a conductive layer may be disposed within the open (e.g., removed) portion of the polymer layer 101b to serve as the seed layer for plating the conductive layer 105. In FIG. 2I, the solder ball 108 is coupled to the conductive layer 105.

Figure 3:
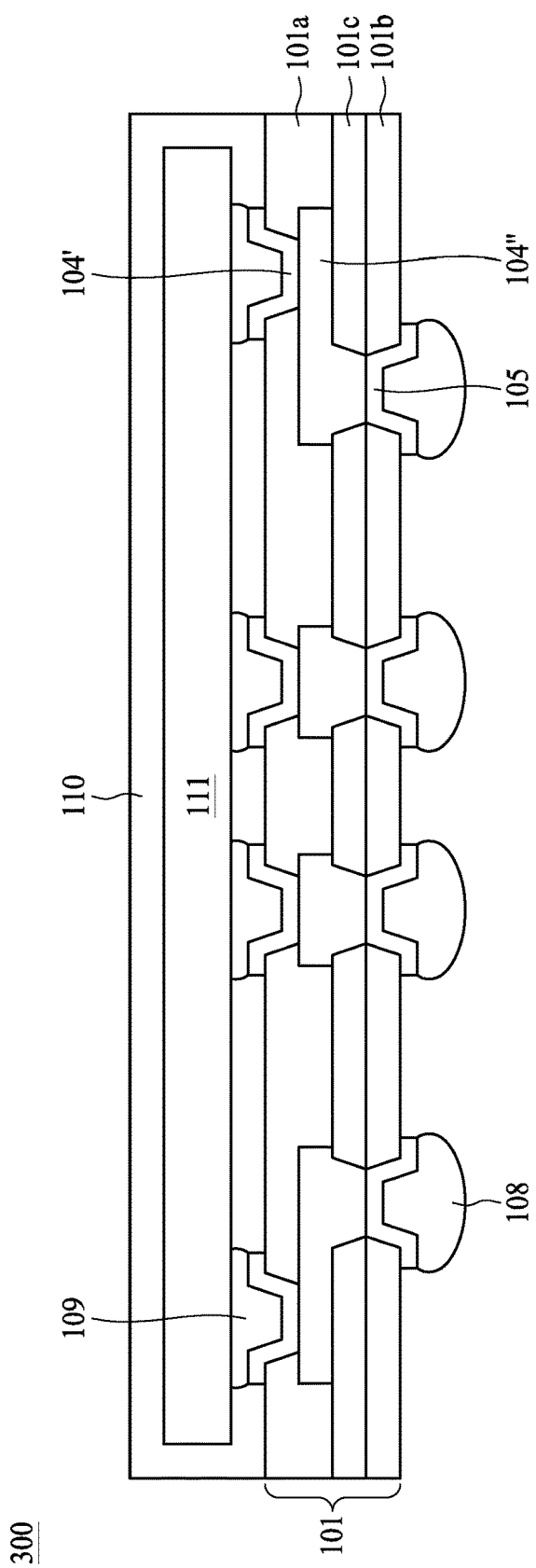
FIG. 3 is a cross-sectional view of a semiconductor package in accordance with some embodiments of the present disclosure.

FIG. 3 is a cross-sectional view of a semiconductor package 300 in accordance with some embodiments of the present disclosure. The semiconductor package 300 includes a package structure that is similar to the semiconductor package structure 100b as described and illustrated with reference to FIG. 1B. The semiconductor package 300 includes the passivation layer 101 and conductive layers 104', 104" and 105. The conductive layer 104' is electrically coupled to the semiconductor structure 111 via the solder ball 109. The conductive layer 105 may be electrically coupled to external circuits/structures via the solder ball 108. The semiconductor structure 111 may be a semiconductor die. The semiconductor structure 111 is encapsulated in the molding compound 110. The passivation layer 101 includes polymer layers 101a, 101b, 101c. The conductive layer 104" may be a redistribution layer (RDL) that connects the conductive layer 104' to the conductive layer 105. Additional conductive layers may be formed between the conductive layer 104' and the conductive layer 104" and between the conductive layer 104" and the conductive layer 105 (e.g., the conductive layer 103 as shown in FIG. 1A).

FIGS. 4A-4J schematically illustrate operations for a method of manufacturing a semiconductor package in accordance with some embodiments of the present disclosure.

Figure 4A:
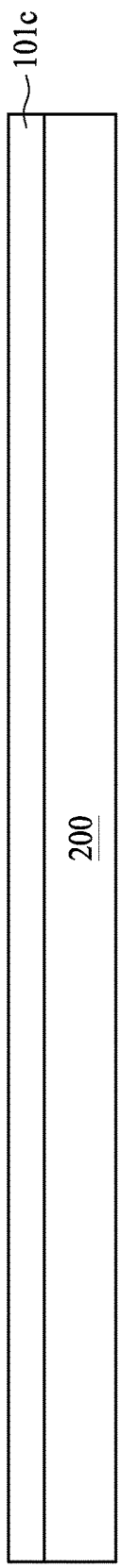
Figure 4B:
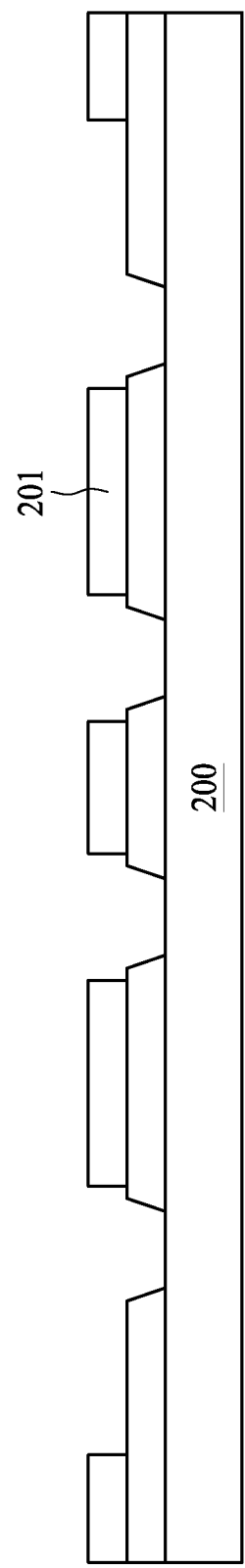
Figure 4C:
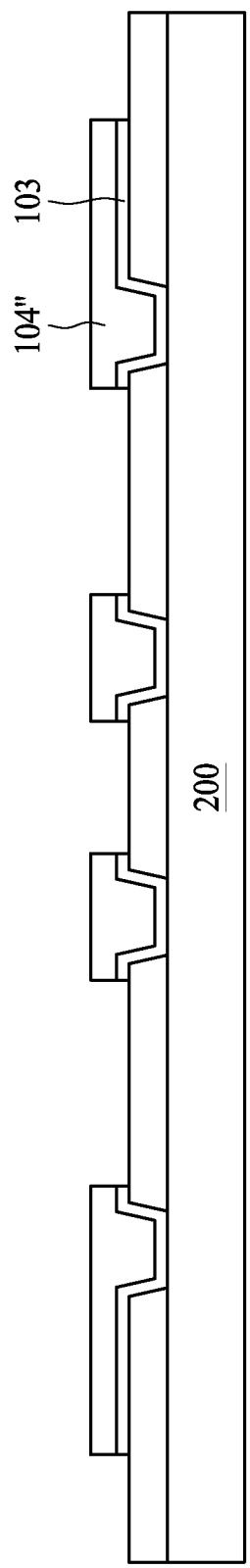
Figure 4D:
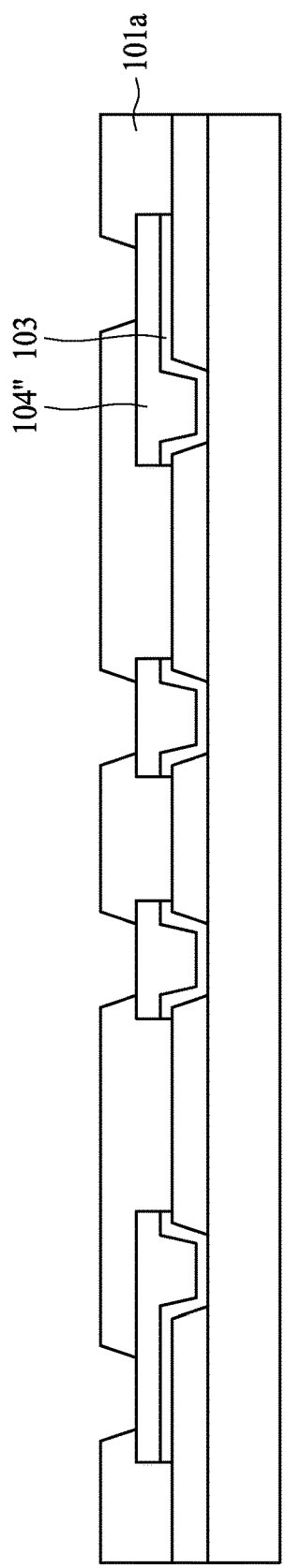
Figure 4E:
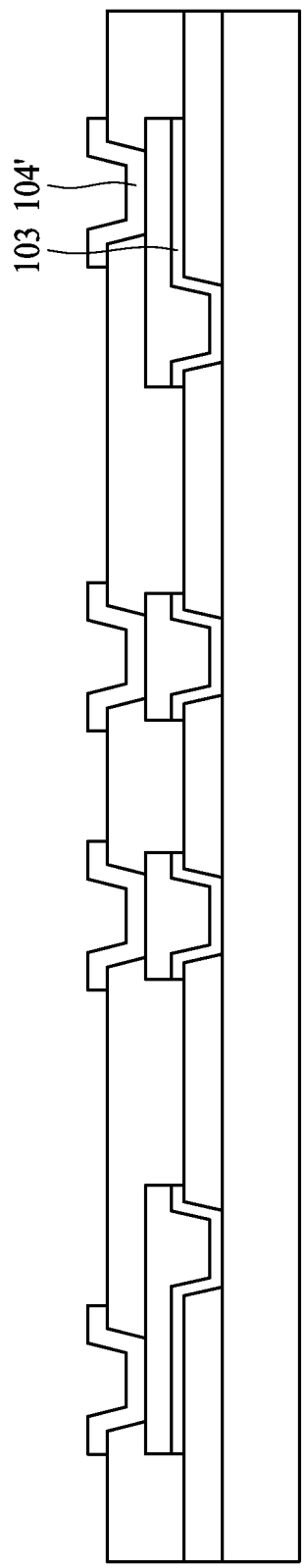
Figure 4F:
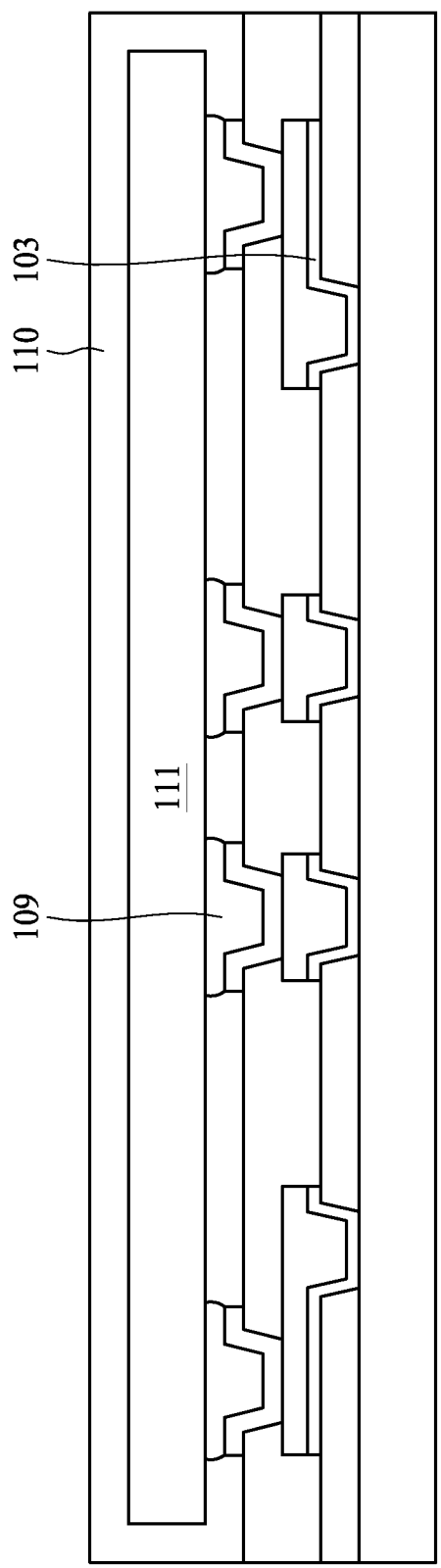
Figure 4G:
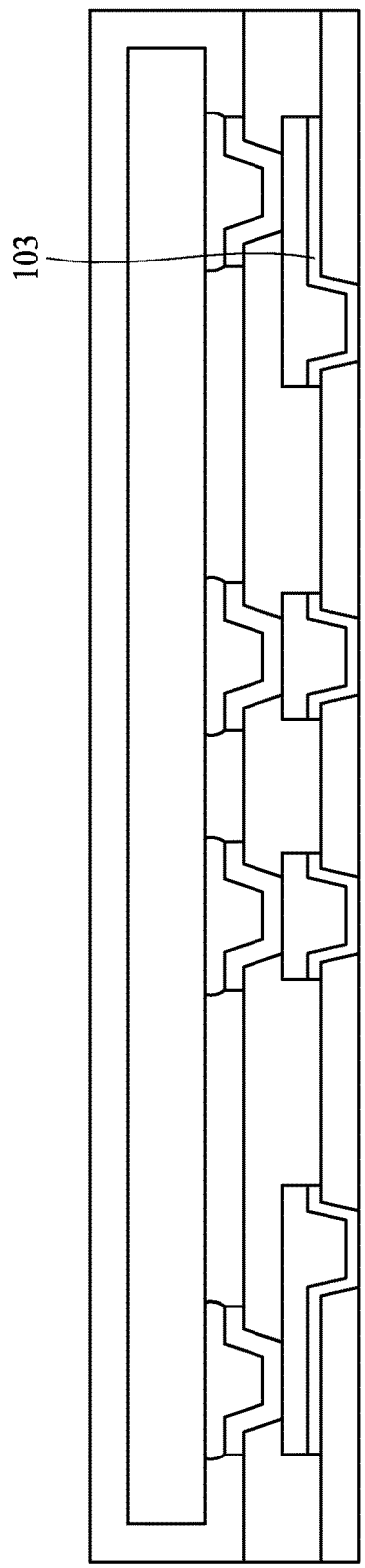
Figure 4H:
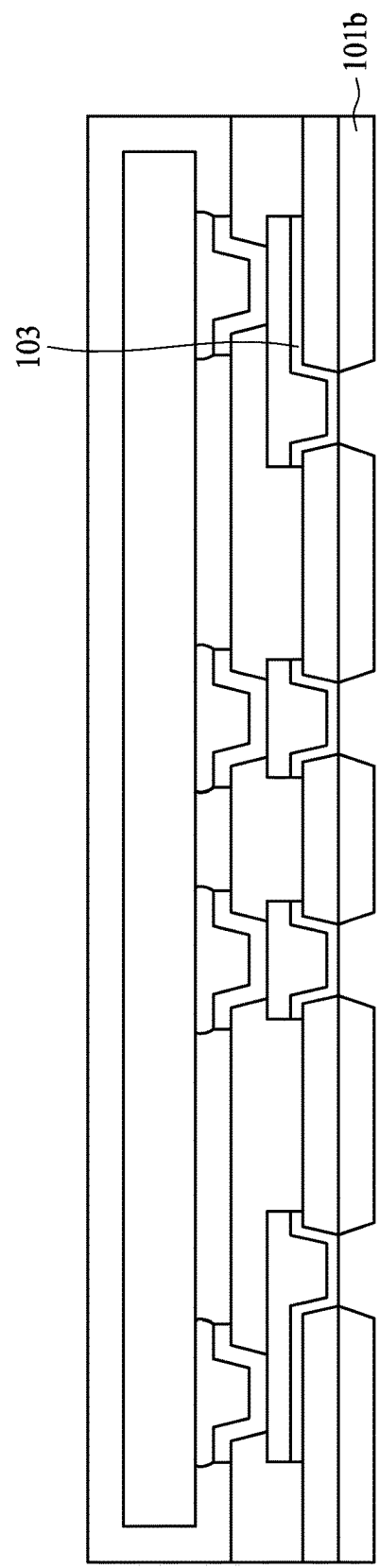
Figure 4J:
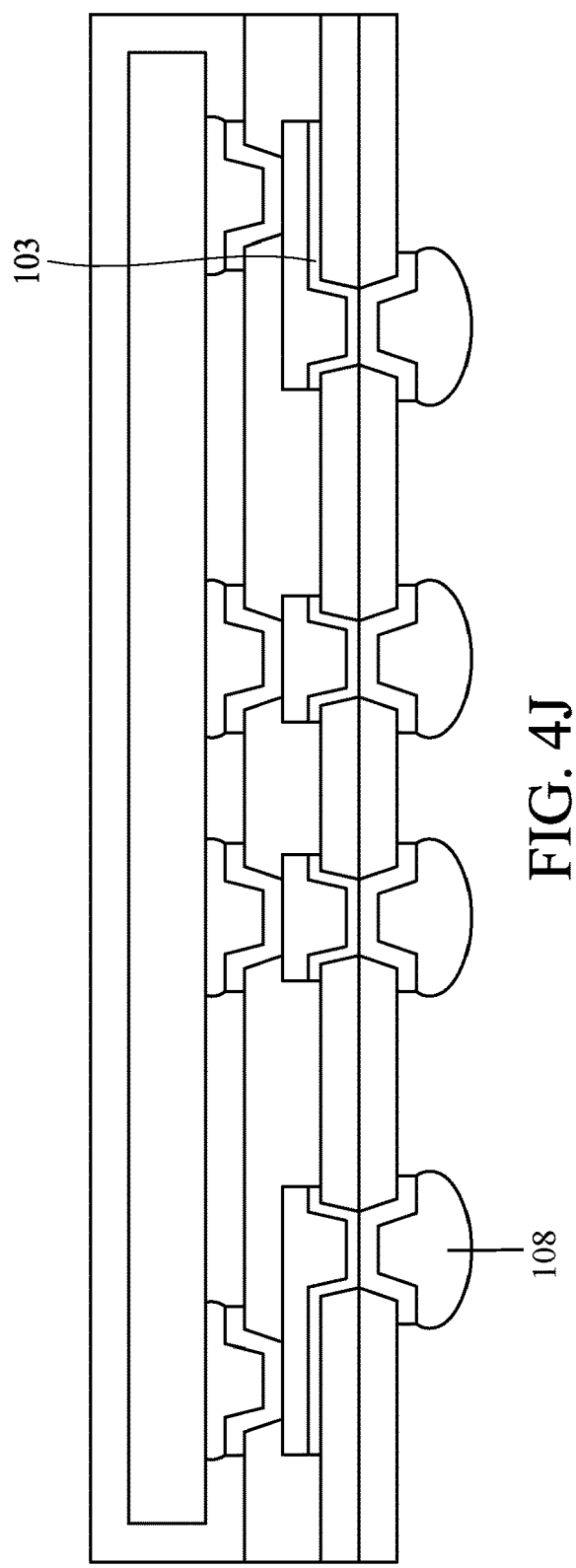

In FIG. 4A, the carrier 200 is provided. The polymer layer 101c is applied or disposed on a surface of the carrier 200. In FIG. 4B, the photoresist layer 201 is applied or disposed on a surface of the polymer layer 101c. The photoresist layer 201 is patterned to expose part of the underlying polymer layer 101c. The exposed portion of the underlying polymer layer 101c is removed (e.g., by an etching process). In FIG. 4C, the conductive layer 103 is disposed within the removed portion of the polymer layer 101c and a conductive layer 104" is disposed on the conductive layer 103 (e.g., by plating). In FIG. 4D, another polymer layer 101a is applied or disposed on the polymer layer 101c. The polymer layer 101a is patterned to expose the underlying conductive layer 104". In FIG. 4E, a conductive layer 104' is disposed within the open (e.g., removed) portion of the polymer layer 101a and on the exposed portion of the conductive layer 104" (e.g., by plating). Alternatively, a conductive layer may be disposed within the open (e.g., removed) portion of the polymer layer 101a to serve as the seed layer for plating the conductive layer 104'. In FIG. 4F, the conductive layer 104' is electrically coupled to the semiconductor structure (e.g., the semiconductor die) 111 via the solder ball 109. The semiconductor structure (e.g., the semiconductor die) 111 is then encapsulated in the molding compound 110. In FIG. 4G, the carrier 200 is removed. In FIG. 4H, the polymer layer 101b is applied or disposed on a surface of the polymer layer 101a. The polymer layer 101b is patterned to expose the conductive layer 104" (and the conductive layer 103). In FIG. 4I, the conductive layer 105 is disposed within the open (e.g., removed) portion of the polymer layer 101b (e.g., by plating). Alternatively, a conductive layer may be disposed within the open (e.g., removed) portion of the polymer layer 101b to serve as the seed layer for plating the conductive layer 105. In FIG. 4J, the solder ball 108 is coupled to the conductive layer 105.

FIGS. 5A-5F schematically illustrate semiconductor package structures in cross-sectional views in accordance with various embodiments of the present disclosure.

Figure 5A:
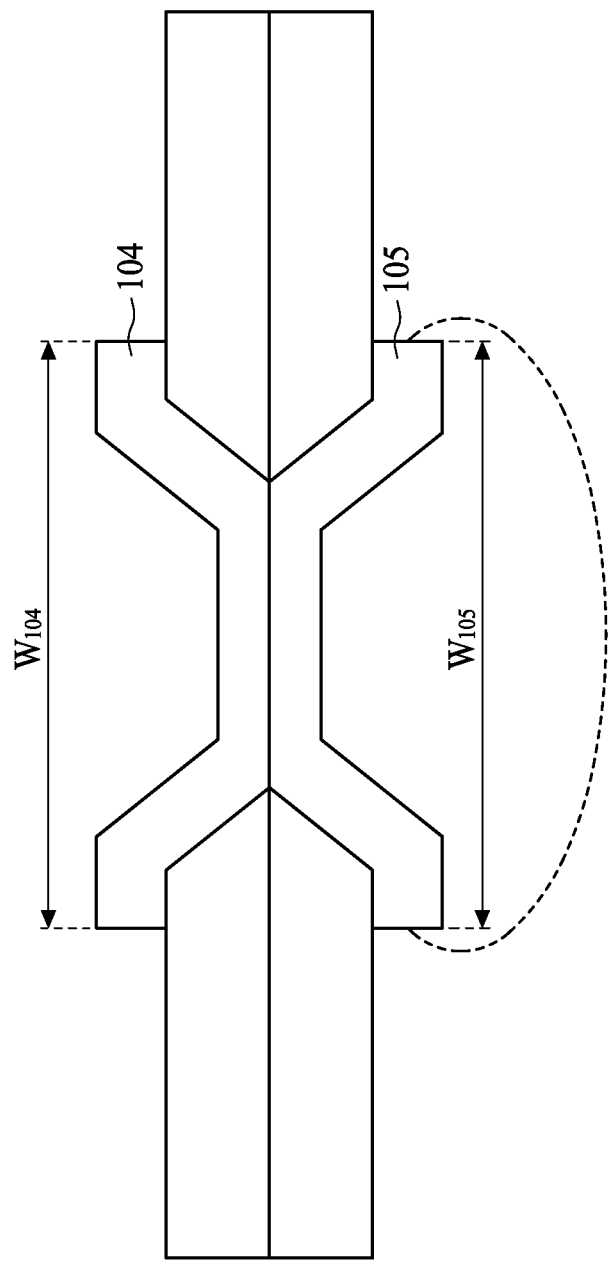
FIG. 5A illustrates a cross-sectional view of a semiconductor package in accordance with some embodiments of the present disclosure.
Figure 5C:
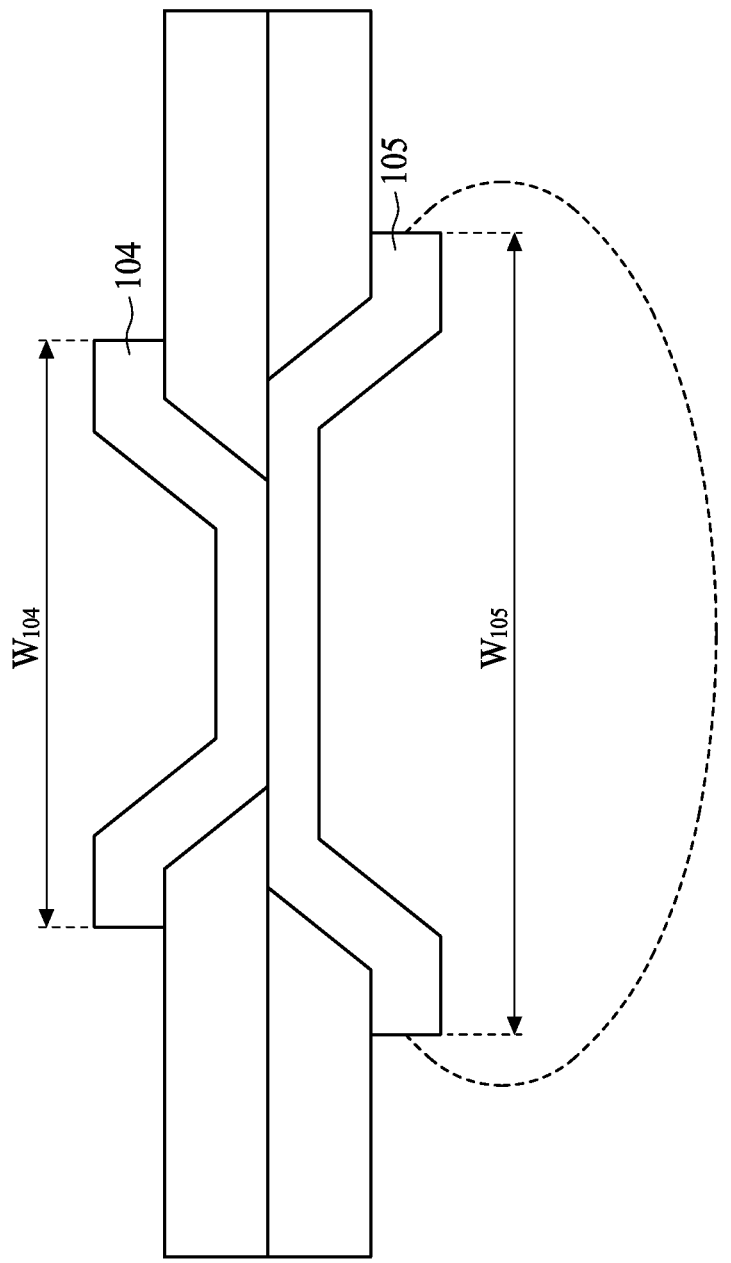
FIG. 5C illustrates a cross-sectional view of a semiconductor package in accordance with some embodiments of the present disclosure.
Figure 5D:
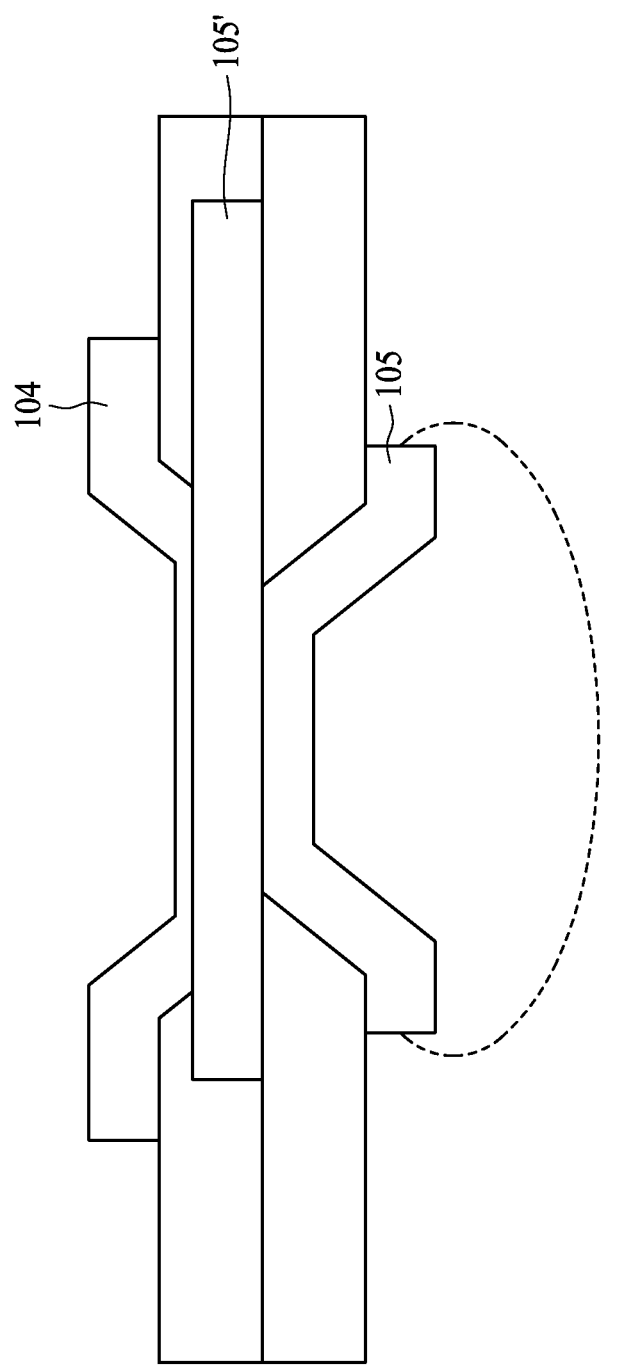
FIG. 5D illustrates a cross-sectional view of a semiconductor package in accordance with some embodiments of the present disclosure.

In FIG. 5A, the width of the conductive layer 104 $W_{104}$ is substantially the same as the width of the conductive layer 105 $W_{105}$. In FIG. 5B, the width of the conductive layer 104 $W_{104}$ is larger than the width of the conductive layer 105 $W_{105}$. In FIG. 5C, the width of the conductive layer 104 $W_{104}$ is smaller than the width of the conductive layer 105 $W_{105}$. Using conductive layers 104 and 105 having different widths allows different sizes of bonding material (e.g., solder balls) to be utilized. In FIG. 5D, an additional conductive layer 105' is disposed between the conductive layer 104 and the conductive layer 105. The conductive layer 105' can extend in the lateral direction so as to be electrically connected to other semiconductor elements. In FIG. 5E, the conductive layer 104 can be connected to another conductive layer 104d disposed in an upper passivation layer. In FIG. 5F, another conductive layer 104e may be disposed on top of the conductive layer 104.

In the description of some embodiments, a component provided "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. As used herein, the singular terms "a," "an," and "the" may include plural referents unless the context clearly dictates otherwise.

As used herein, the terms "conductive" and "electrically connected" refer to an ability to transport an electric current. Conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
a passivation layer having a first surface and a second surface opposite to the first surface, the passivation layer defining a through hole extending from the first surface to the second surface, the through hole further defined by a first sidewall and a second sidewall of the passivation layer;
a first conductive layer on the first surface of the passivation layer and the first sidewall;
a second conductive layer on the second surface of the passivation layer and the second sidewall; and
a third conductive layer between the first conductive layer and the second conductive layer,
wherein the third conductive layer comprises a first seed layer adjacent to the first conductive layer and a second seed layer adjacent to the second conductive layer,
wherein the passivation layer comprises a first polymer layer and a second polymer layer,
wherein the first seed layer is disposed between the first conductive layer and the first polymer layer and the second seed layer is disposed between the second conductive layer and the second polymer layer.

2. The semiconductor package according to claim 1, wherein the first conductive layer and the second conductive layer are separated by the third conductive layer.

3. The semiconductor package according to claim 1, wherein the first seed layer extends to the first surface of the passivation layer and the second seed layer extends to the second surface of the passivation layer.

4. The semiconductor package according to claim 1, wherein the first conductive layer comprises a first portion on the first surface, a second portion on the first sidewall and a third portion in the through hole and extending substantially parallel to the first surface.

5. The semiconductor package according to claim 4, wherein the second conductive layer comprises a first portion on the second surface, a second portion on the second sidewall and a third portion in the through hole and extending substantially parallel to the second surface.

6. The semiconductor package according to claim 5, wherein the first portion of the first conductive layer has greater dimensions than dimensions of the first portion of the second conductive layer.

7. The semiconductor package according to claim 1, wherein the third conductive layer is formed of a titanium-copper alloy.

8. The semiconductor package according to claim 1, wherein a total thickness of the first conductive layer, the second conductive layer and the third conductive layer in the through hole is smaller than a thickness of the passivation layer.

9. A semiconductor package, comprising:
a passivation layer having a first surface and a second surface opposite to the first surface, the passivation layer defining a through hole extending from the first surface to the second surface, the through hole being further defined by a sidewall of the passivation layer;
a first conductive layer between the first surface and the second surface of the passivation layer and sealing the through hole;
a second conductive layer adjacent to the first conductive layer; and
a third conductive layer opposite the second conductive layer and adjacent to the first conductive layer,
wherein the first conductive layer comprises a first seed layer adjacent to the second conductive layer and a second seed layer adjacent to the third conductive layer,
wherein the passivation layer comprises a first polymer layer and a second polymer layer,
wherein the first seed layer is disposed between the second conductive layer and the first polymer layer and the second seed layer is disposed between the third conductive layer and the second polymer layer.

10. The semiconductor package according to claim 9, further comprising a bonding metal and a semiconductor die that is electrically connected to the first conductive layer through the bonding metal.

11. The semiconductor package according to claim 9, wherein the passivation layer is formed of a photosensitive material.

12. The semiconductor package according to claim 9, wherein the passivation layer is formed of a polymer.

13. The semiconductor package according to claim 12, wherein the polymer comprises polyimide.

14. The semiconductor package according to claim 9, wherein the second conductive layer extends on the first surface of the passivation layer.

15. The semiconductor package according to claim 9, wherein the third conductive layer extends on the second surface of the passivation layer.

* * * * *